(12) United States Patent
Barr et al.

(10) Patent No.: US 6,933,853 B2
(45) Date of Patent: Aug. 23, 2005

(54) APPARATUS AND METHOD FOR DETECTING AND COMMUNICATING INTERCONNECT FAILURES

(75) Inventors: Andrew Harvey Barr, Roseville, CA (US); Dale John Shidla, Roseville, CA (US); Ken Gary Pomaranski, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 83 days.

(21) Appl. No.: 10/459,853

(22) Filed: Jun. 12, 2003

(65) Prior Publication Data

US 2004/0257090 A1 Dec. 23, 2004

(51) Int. Cl.[7] ............................................. G08B 21/00
(52) U.S. Cl. ....................... 340/653; 324/755; 324/757; 324/758; 324/761; 324/763
(58) Field of Search ................. 340/653; 324/755, 324/757, 758, 761, 763

(56) References Cited

U.S. PATENT DOCUMENTS

| | | | | |
|---|---|---|---|---|
| 5,485,096 A | * | 1/1996 | Aksu | 324/761 |
| 5,996,102 A | * | 11/1999 | Haulin | 714/740 |
| 6,067,027 A | * | 5/2000 | Buer | 340/687 |
| 6,087,842 A | * | 7/2000 | Parker et al. | 324/763 |
| 6,408,352 B1 | * | 6/2002 | Hosaka et al. | 710/301 |
| 6,441,627 B1 | * | 8/2002 | Larson | 324/755 |
| 6,445,188 B1 | | 9/2002 | Lutz et al. | |
| 6,517,369 B1 | | 2/2003 | Butterbaugh et al. | |
| 6,614,253 B2 | * | 9/2003 | Berkely | 324/765 |
| 6,677,744 B1 | * | 1/2004 | Long | 324/158.1 |
| 6,687,777 B2 | * | 2/2004 | Verdun et al. | 710/300 |
| 6,734,683 B2 | * | 5/2004 | Hash | 324/538 |
| 6,791,171 B2 | * | 9/2004 | Mok et al. | 257/678 |

* cited by examiner

*Primary Examiner*—Daniel Wu
*Assistant Examiner*—Samuel J. Walk

(57) ABSTRACT

One embodiment disclosed relates to a printed circuit assembly (PCA) with built-in circuitry to detect and communicate an interconnect failure. The PCA includes a connector, a continuity detect circuit, and an interface circuit. The connector is configured to interconnect to an electronic unit. The continuity detect circuit is coupled to the connector for detection of continuity failure in the interconnect. The interface circuit is coupled to the continuity detect circuit for communicating data pertaining to status of the interconnect to system management.

12 Claims, 9 Drawing Sheets

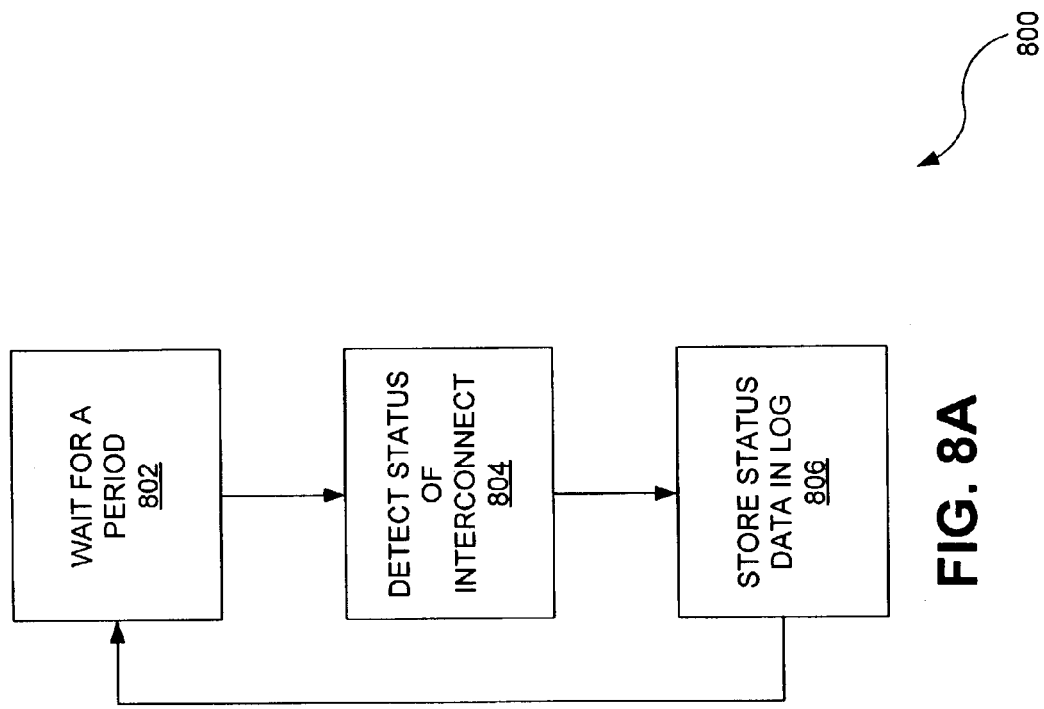

APPARATUS AND METHOD FOR DETECTING AND COMMUNICATING INTERCONNECT FAILURES

BACKGROUND OF THE INVENTION

1. Field of the Invention

The present invention relates generally to electronics and computers.

2. Description of the Background Art

Interconnects of various kinds pose a significant failure mechanism for computer servers. A typical failure mode for interconnects is for a loss of continuity (an open circuit) to occur due to mechanical stress, vibrations, shock, contaminant build-up, poor assembly, and other reasons. This loss of continuity can cause system failures, which are difficult and costly to debug.

Run-time errors occur that may or may not be caused by an interconnect failure. For example, such a run-time error may be a parity error, or a lost clock signal. Determining whether or not the error is due to an interconnect failure is problematic in prior systems and may require the cumbersome step of manually reseating of the part in the connector.

The above-described problems and disadvantages may be overcome by utilizing embodiments of the present invention.

SUMMARY

One embodiment of the invention pertains to a printed circuit assembly (PCA) with built-in circuitry to detect and communicate an interconnect failure. The PCA includes a connector, a continuity detect circuit, and an interface circuit. The connector is configured to interconnect to an electronic unit. The continuity detect circuit is coupled to the connector for detection of continuity failure in the interconnect. The interface circuit is coupled to the continuity detect circuit for communicating data pertaining to status of the interconnect to system management.

Another embodiment of the invention relates to a method for detection and communication of an interconnect failure. Status of an interconnect between a connector on a printed circuit assembly (PCA) and an electronic unit seated in the connector is determined. The status of the interconnect is communicated to system management software.

Another embodiment of the invention relates to a system for detection and communication of an interconnect failure. The system includes at least a printed circuit assembly and a system manager. The printed circuit assembly includes a connector configured to interconnect to an electronic unit, a continuity detect circuit coupled to the connector for detecting continuity failure in the interconnect, and an interface circuit coupled to the continuity detect circuit and configured to transmit an interconnect failure message upon the detection of said continuity failure. The system manager includes a failure handling routine to be executed in response to receipt of the interconnect failure message.

BRIEF DESCRIPTION OF THE DRAWINGS

FIGS. 8A and 8B are flow charts depicting a method for detecting and communicating an interconnect failure in accordance with another embodiment of the invention.

DETAILED DESCRIPTION

Figure 1:
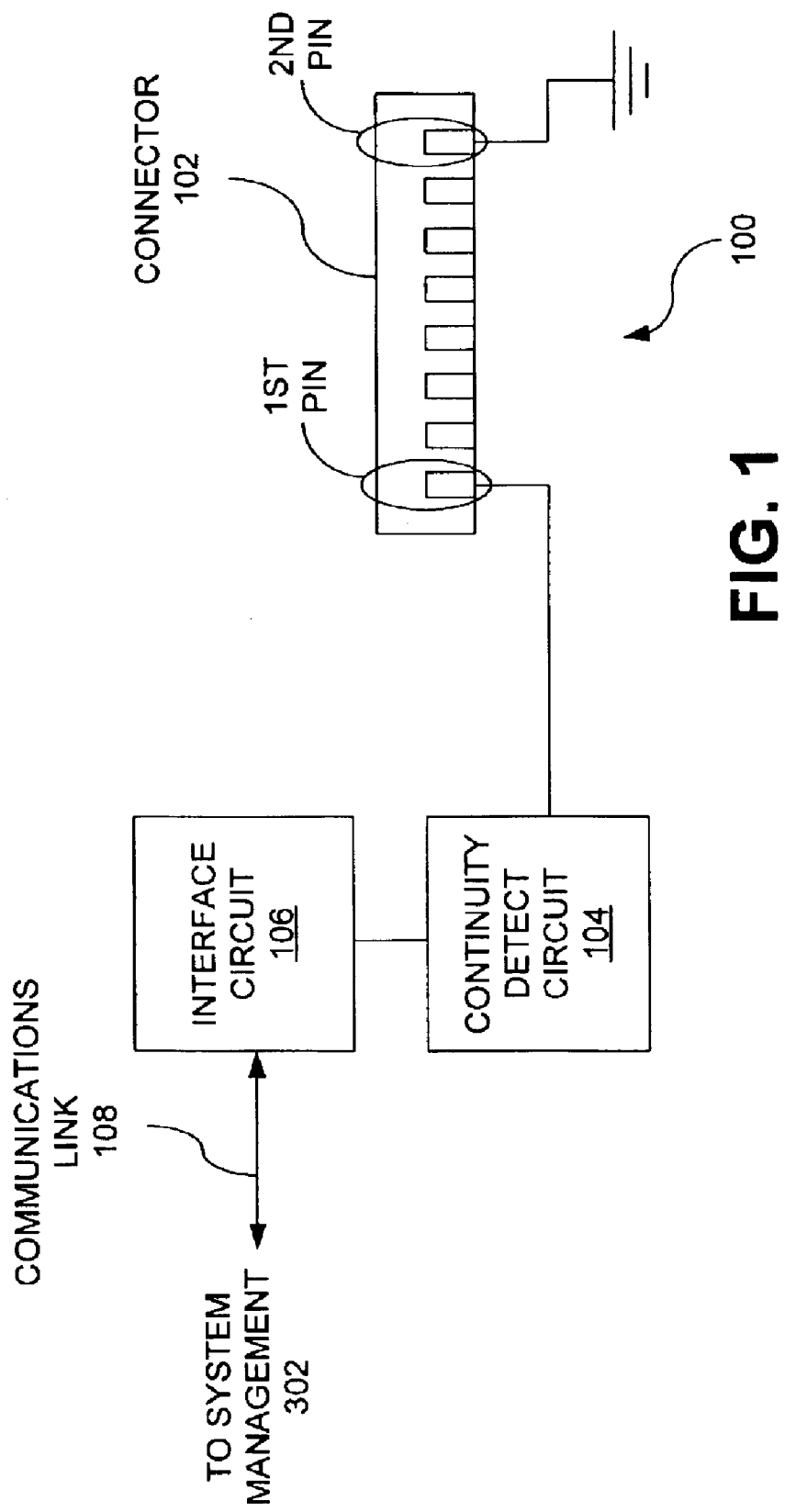
FIG. 1 is a schematic diagram depicting a printed circuit assembly (PCA) in accordance with an embodiment of the invention.

FIG. 1 is a schematic diagram depicting a printed circuit assembly (PCA) 100 in accordance with an embodiment of the invention. In one example, the PCA 100 may comprise a motherboard for a computer server. In other examples, the PCA 100 may comprise a motherboard for a personal computer, or a board used for an electronic system.

The components of the circuitry include a connector 102, a continuity detect circuit 104, and an interface circuit 106. In addition to the depicted circuitry, there is of course other circuitry (not shown) on the PCA 100 to perform other functions.

The connector 102 may comprise an interconnect of various kinds, such as, for example, a printed circuit board to printed circuit board (PCB-to-PCB) connector. For instance, the connector 102 may connect a daughter board (daughter card) to a motherboard. The daughter board may comprise a memory module, an input/output (I/O) board, or a processor board. The connector 102 may comprise, for example, a slot for a printed edge connector. Other types of connectors may also be utilized. In some embodiments, the card may be connected via a cable to the connector. The connector 102 is illustrated as having eight conductive "pins" for connecting to a card, but the number of pins will vary depending on the actual type of connector. One particular example of a connector 102 would be a connector for a dual in-line memory module (DIMM).

In this embodiment, two pins on the connector 102 are specifically designated for use in verification of proper card seating. A first designated pin of the connector 102 is conductively connected to the continuity detect circuit 104. A second designated pin of the connector 102 is electrically grounded. In a preferred embodiment, these first and second pins may be on or towards opposite ends of the connector 102. By configuring the first and second pins towards opposite ends, mis-seating of a card in the connector 104 may be efficiently determined.

The continuity detect circuit (CDC) 104 is utilized to detect continuity failure in the interconnect. For example, the CDC 104 may include a continuity testing circuit that determines whether or not the first pin is at a particular voltage level, such as, for example, electrical ground. In one implementation, a diode in the CDC 104 may be configured such that an electrical current flows through it when the first pin is electrically grounded, and no electrical current flows through it when the voltage on the first pin is floating. As discussed further below, if the first pin voltage is floating, then an interconnect failure is considered to have been detected.

The interface circuit 106 is coupled to the CDC 104. The interface circuit 106 communicates data pertaining to the status of the interconnect to system management. The data is communicated via a communications link 108. For example, the interface circuit 106 may comprise an interface to a serial bus, such as an I²C bus.

Figure 2:
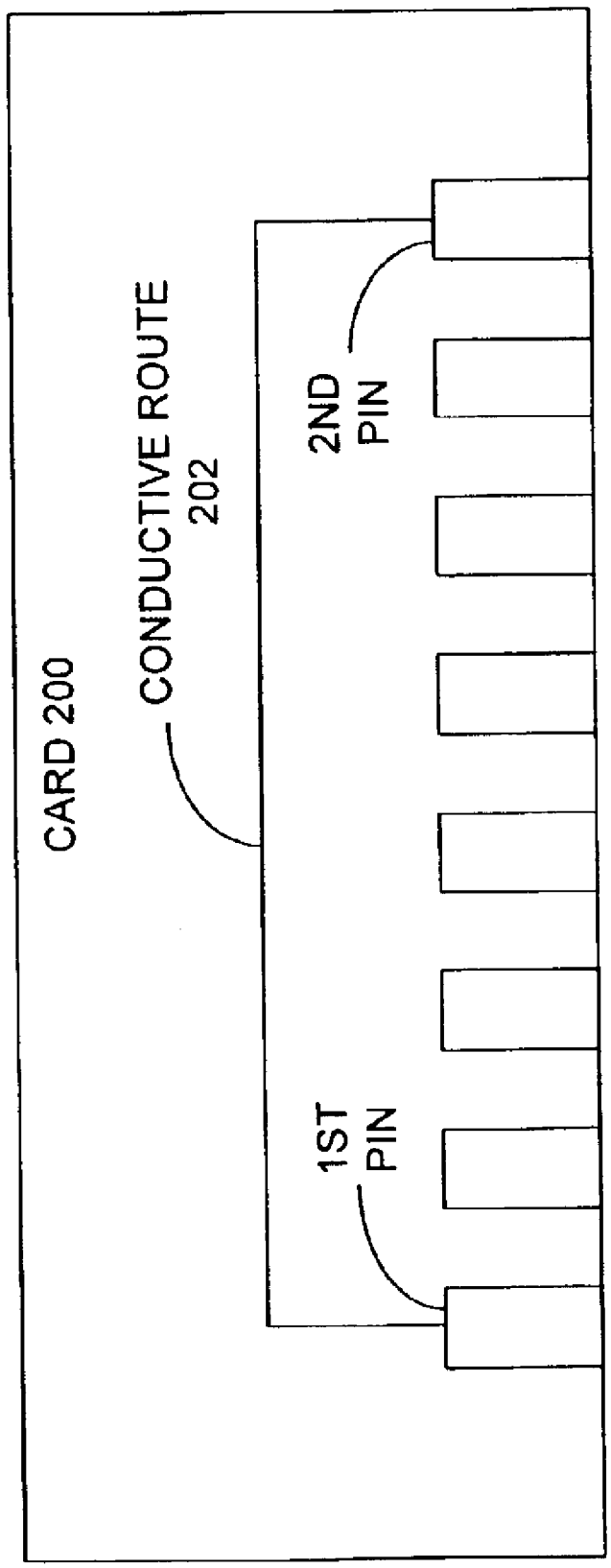
FIG. 2 is a schematic diagram depicting circuitry on a card to be connected to the PCA of FIG. 1.

FIG. 2 is a schematic diagram depicting circuitry on a card 200 to be connected to the PCA 100 of FIG. 1. The card 200 includes conductive pads (pins) that correspond to the pins on the PCA 100 for connecting thereto. In particular, there are a first pin and a second pin on the card 200 that correspond to the first and second designated pins on the PCA 100. In addition to other circuitry (not shown) on the card 200, there is a conductive route or signal trace 202 on the card 200 between the first pin and the second pin. This conductive route 202 enables the verification of proper loading of the card 200 into the connector 102.

The PCA 100 of FIG. 1 and the card 200 of FIG. 2 operate together as follows. If the card 200 is properly seated in the connector 102, then there will be a conductive path from the first pin (through the conductive route 202 and the second pin) to electrical ground. If the card 200 is not properly seated in the connector 102, then there would be an open circuit such that the voltage on the first pin would be left floating. This open circuit would be caused by a lack of electrical connection between the PCA 100 and the card 200 at either the first pin location, or the second pin location, or both.

Figure 3:
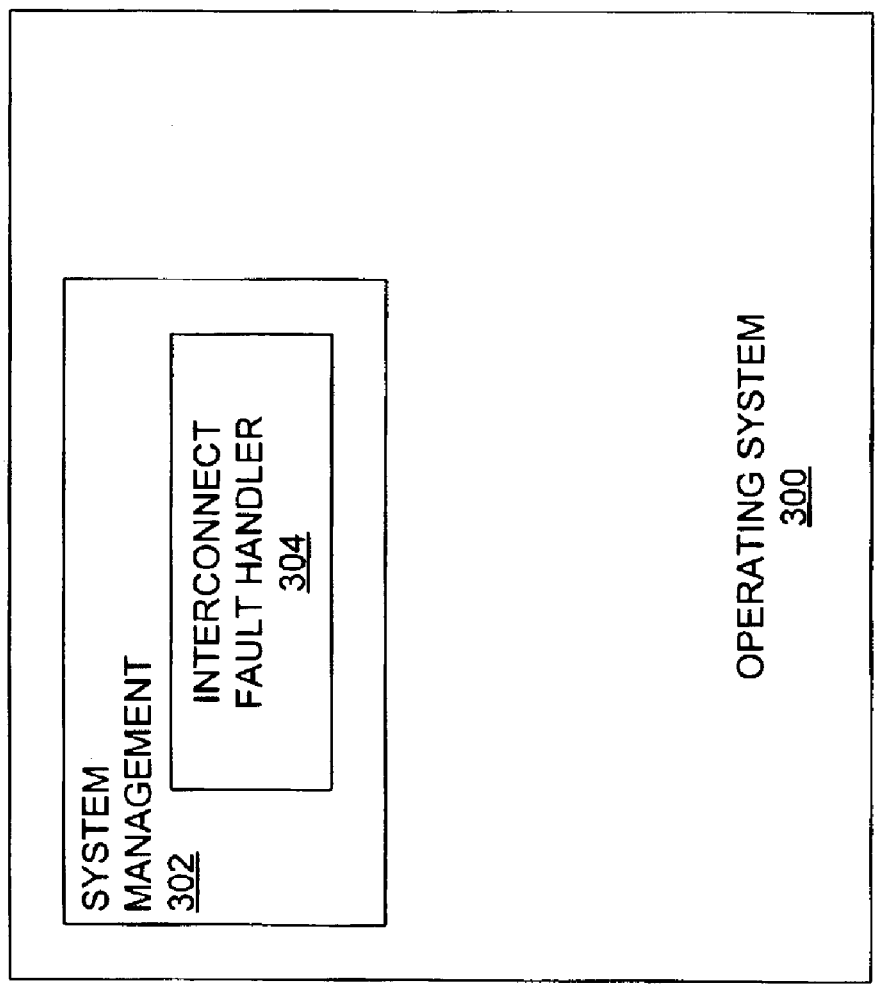
FIG. 3 is a schematic diagram of an operating system including system management software in accordance with an embodiment of the invention.

FIG. 3 is a schematic diagram of an operating system 300 including system management software 302 in accordance with an embodiment of the invention. The operating system 300 may comprise, for example, the operating system for a server, for a workstation or personal computer, for a router, or other electronic system. For example, the operating system 300 may comprise a version of UNIX®, such as HP-UX® available from the Hewlett-Packard Company of Palo Alto, Calif., or Solaris® available from Sun Microsystems of Palo Alto, Calif., or Linux®. As another example, the operating system 300 may comprise a version of the Windows Server® or Windows® operating system available from Microsoft of Redmond, Wash.

The operating system 300 includes a module or modules that provide system management 302 functionalities. For example, these functionalities may include device management, power management, and various other functionalities.

In accordance with an embodiment of the invention, the system management software 302 includes an interconnect fault handler 304. The interconnect fault handler 304 comprises a software component that receives notice of and responds to detected interconnect faults.

In accordance with another embodiment, an alternate software architecture may be utilized. For example, the interconnect failure handling routine may reside in lower-level code, such as the basic input/output system (BIOS) or firmware. The operating system could then make use of this lower-level resource.

Figure 4:
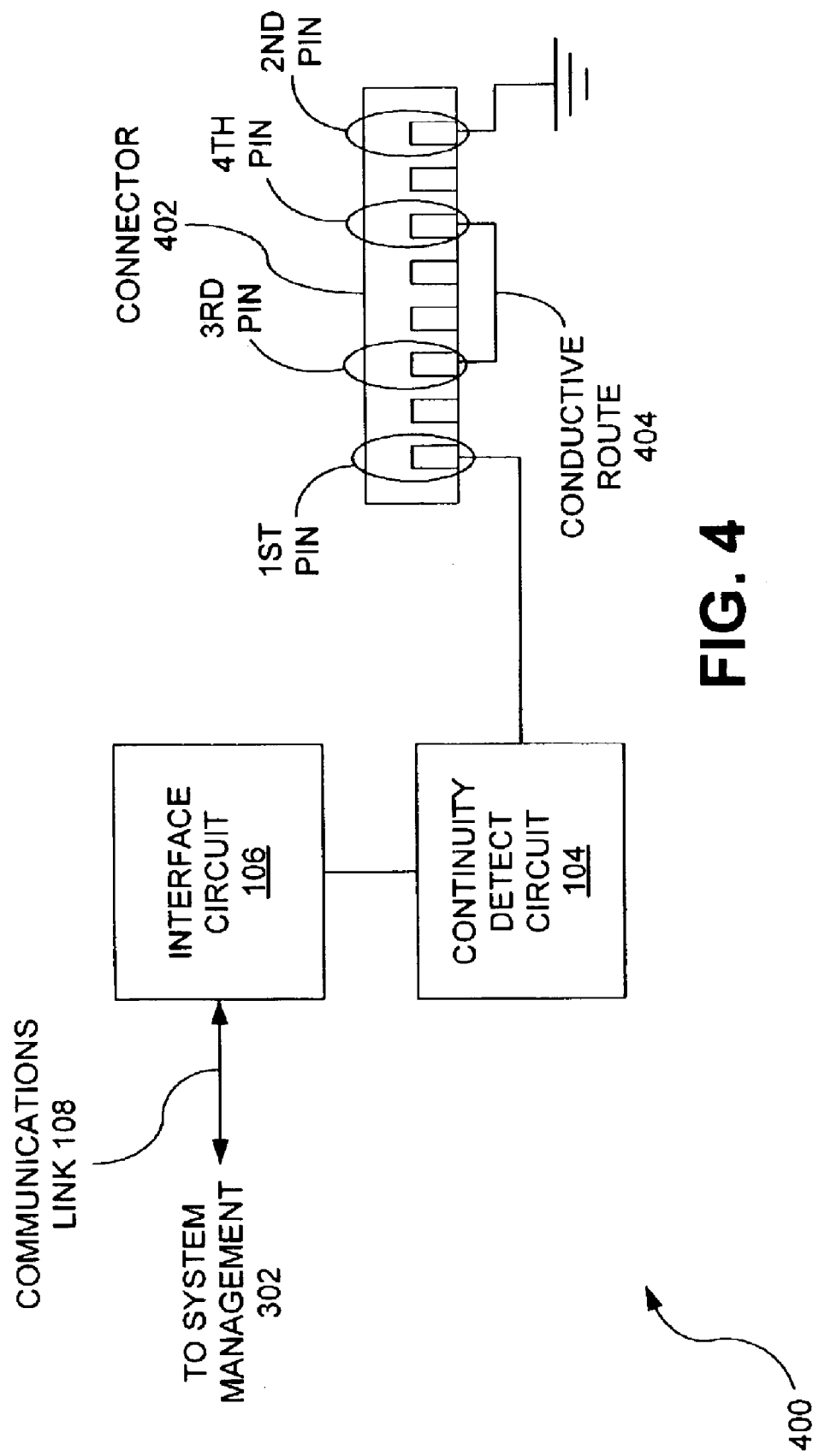
FIG. 4 is a schematic diagram depicting a PCA with a connector to a card in accordance with another embodiment of the invention.

FIG. 4 is a schematic diagram depicting a PCA 400 with a connector 402 to a card in accordance with another embodiment of the invention. In one example, the PCA 400 may comprise a motherboard for a computer server. In other examples, the PCA 400 may comprise a motherboard for a personal computer, or a board used for an electronic system.

The circuitry of FIG. 4 includes the components and connections of the circuitry of FIG. 1. In addition, the circuitry of FIG. 3 includes two more specially designated pins of the connector 402 to further enhance the verification of proper card seating. These two additional pins comprise a third designated pin and a fourth designated pin. These two pins may be located at distributed points along the connector 402 to further detect mis-seating of a card therein. Furthermore, the PCA 400 includes conductive routing (i.e. a signal trace) 404 to electrically connect the third and fourth pins together.

Figure 5:
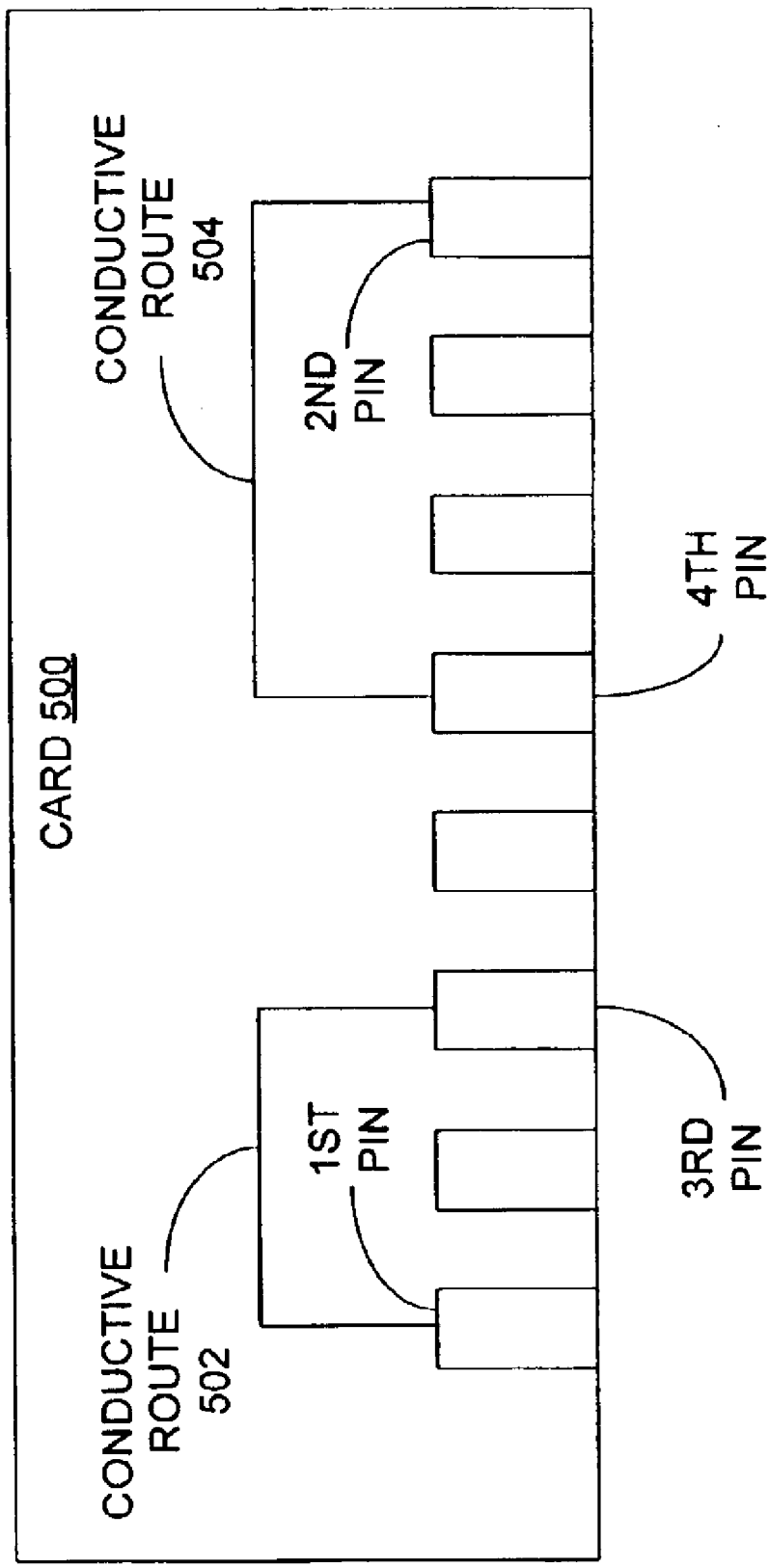
FIG. 5 is a schematic diagram depicting circuitry on a card to be connected to the PCA of FIG. 4.

FIG. 5 is a schematic diagram depicting circuitry on a card 500 to be connected to the PCA 400 of FIG. 4. The card 500 includes conductive pads (pins) that correspond to the pins on the PCA 400 for connecting thereto. In particular, there are first, second, third and fourth designated pins on the card 500 that correspond to the first, second, third and fourth designated pins on the PCA 400. In addition to other circuitry (not shown) on the card 500, there is a first conductive route (signal trace) 502 on the card 500 between the first pin and the third pin, and there is a second conductive route (signal trace) 504 between the fourth pin and the second pin. These conductive routes 502 and 504 enable the verification of proper loading of the card 500 into the connector 502.

The PCA 400 of FIG. 4 and the card 500 of FIG. 5 operate together as follows. If the card 500 is properly seated in the connector 402, then there will be a conductive path from the first pin (through the conductive route 502 to the third pin, through the conductive route 404 to the fourth pin, then through the conductive route 504 to the second pin) to electrical ground. If the card 500 is not properly seated in the connector 402, then there would be an open circuit such that the voltage on the first pin would be left floating. This open circuit would be caused by a lack of electrical connection between the PCA 100 and the card 200 at one or more designated pin location.

Figure 6:
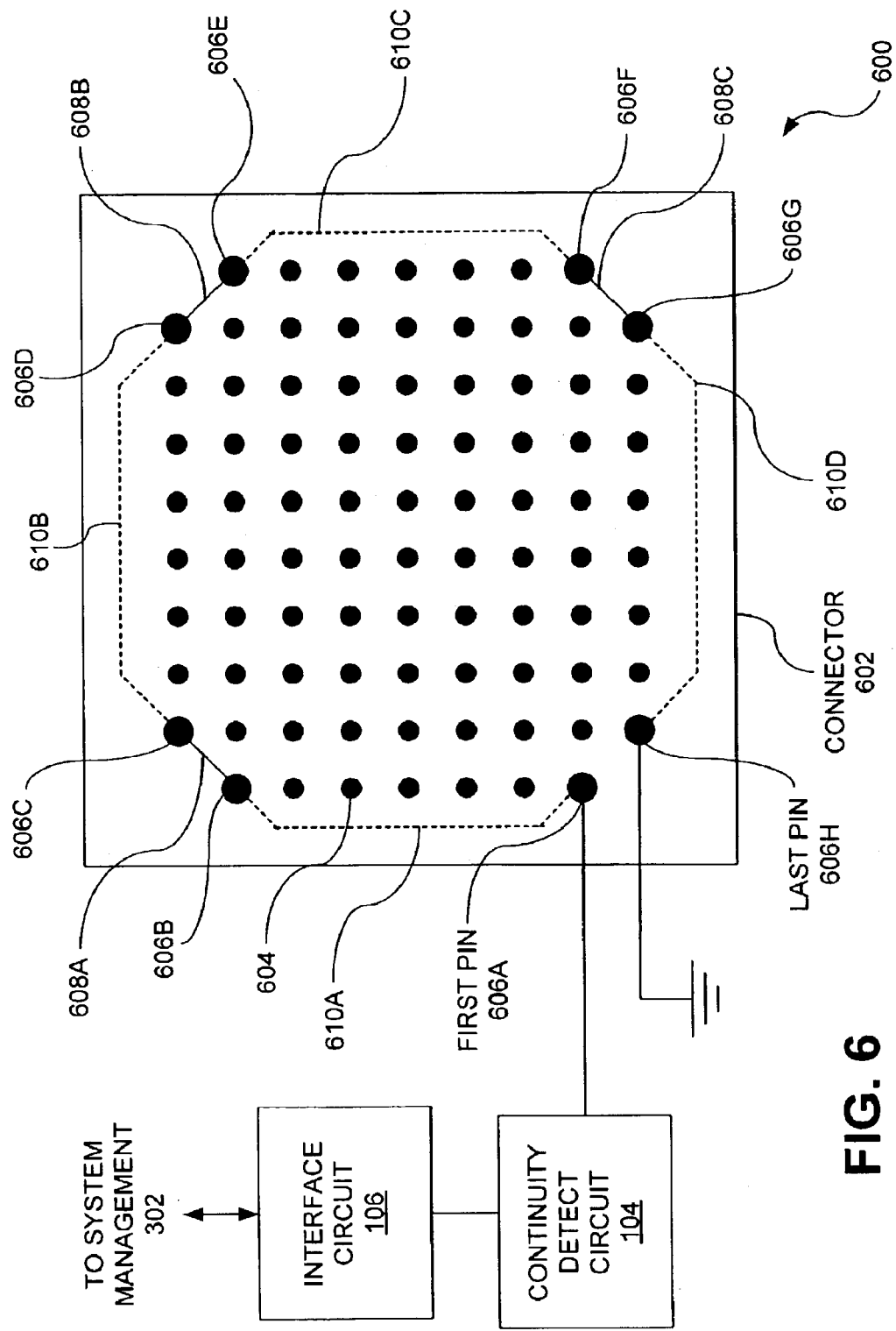
FIG. 6 is a schematic diagram depicting a PCA with a connector to a packaged integrated circuit in accordance with another embodiment of the invention.

FIG. 6 is a schematic diagram depicting a PCA 600 with a connector 602 to an integrated circuit (IC) package in accordance with another embodiment of the invention. In one example, the PCA 600 may comprise a motherboard for a computer server. In other examples, the PCA 600 may comprise a motherboard for a personal computer, or a board used for an electronic system. The IC may comprise an ASIC, or a microprocessor, or other type of IC.

The components of the circuitry include a connector 602, a continuity detect circuit 104, and an interface circuit 106. In addition to the depicted circuitry, there is of course other circuitry (not shown) on the PCA 600 to perform other functions.

The connector 602 connects to the packaged IC (not illustrated). For example, the connector 602 may comprise a connector for a pinned IC package, or a connector for a land grid array (LGA) IC package. Other types of connectors may also be utilized. The connector 602 is illustrated as having a specific number of conductive "pin" connectors 604, but the number of pin connectors 604 will vary depending on the actual type of connector 602. In the following, we refer to these pin connectors 604 as simply "pins".

In this embodiment, two or more of the pins 604 on the connector 602 are specifically designated for use in verification of proper IC seating. In the example illustrated in FIG. 6, these specifically designated pin connectors 606 are shown darker than the other pins 604. A first designated pin 606A of the connector 602 is conductively connected to the continuity detect circuit 104. A last designated pin 606H of the connector 602 is electrically grounded. Besides the first and last designated pins, there may be additional such designated pins 604. The example of FIG. 6 has six such additional pins (606B, 606C, 606D, 606E, 606F, and 606G). In the illustrated example, there is a conductive route 608

(shown by solid lines in FIG. 6) between each of the three pairs of additional pins (conductive route 608A connects pins 606B and 606C, conductive route 608B connects pins 606D and 606E, and conductive route 608E connects pins 606F and 606G).

For example, the designated pins 608 may be located near the corners of the array of pins for a connector to a pinned IC package. As another example, the designated pins 608 may be located near the center of the array of pins for a connector to a LGA IC package. By such appropriate selection of the pins 604 to be such designated pins 608, mis-seating of a packaged IC in the connector 104 may be efficiently determined.

In cooperation with the connector 602 on the PCA 600, the corresponding packaged IC (not illustrated) has a corresponding array of "pins" that connect to the "pins" 604 of the connector 602. In the array of pins of the IC package, there are also specifically designated pins for use in verification of proper IC seating. The specifically designated pins on the IC package correspond to the specifically designated pins on the associated connector 602. There are also conductive routes 610 on the IC package. These routes 610 are at locations that are different from, but complementary to, the routes 608 on the associated connector 602. In the illustrated example of FIG. 6, the conductive routes 610 on the IC package are indicated by four dashed lines (610A, 610B, 610C, and 610D). The first route 610A on the IC package connects the first designated pin 606A to the second designated pin 606B. The second route 610B on the IC package connects the third designated pin 606C to the fourth designated pin 606D. The third route 610C on the IC package connects the fifth designated pin 606E to the sixth designated pin 606F. Finally, the last route 610D on the IC package connects the seventh designated pin 606G to the last designated pin 606H. Note that the routing shown in FIG. 6 is not intended to show the specific route paths on the packaged IC or on the connector. Rather, the routing is meant to show which pins are connected together. The specific route paths may vary depending on the specific system.

The PCA 600 of FIG. 6 and the packaged IC operate together as follows. If the packaged IC is properly seated in the connector 602, then there will be a conductive path from the first pin 606A (through the first IC conductive route 610A, to the second pin 606B, to the first PCA conductive route 608A, to the third pin 606C, to the second IC conductive route 610B, to the fourth pin 606D, to the second PCA conductive route 608B, to the fifth pin 606E, to the third IC conductive route 610C, to the sixth pin 606F, to the third PCA conductive route 608C, to the seventh pin 606G, to the last IC conductive route 610D, to the last pin 606H) to electrical ground. If the packaged IC is not properly seated in the connector 602, then there would be an open circuit such that the voltage on the first pin 606A would be left floating. This open circuit would be caused by a lack of electrical connection between the PCA 600 and the IC at one or more designated pin location.

The continuity detect circuit (CDC) 104 is utilized to detect continuity failure in the interconnect. For example, the CDC 104 may include a continuity testing circuit that determines whether or not the first pin is at a particular voltage level, such as, for example, electrical ground. In one implementation, a diode in the CDC 104 may be configured such that an electrical current flows through it when the first pin is electrically grounded, and no electrical current flows through it when the voltage on the first pin is floating. As discussed further below, if the first pin voltage is floating, then an interconnect failure is considered to have been detected.

The interface circuit 106 is coupled to the CDC 104. The interface circuit 106 communicates data pertaining to the status of the interconnect to system management. The data is communicated via a communications link 108. For example, the interface circuit 106 may comprise an interface to a serial bus.

Figure 7:
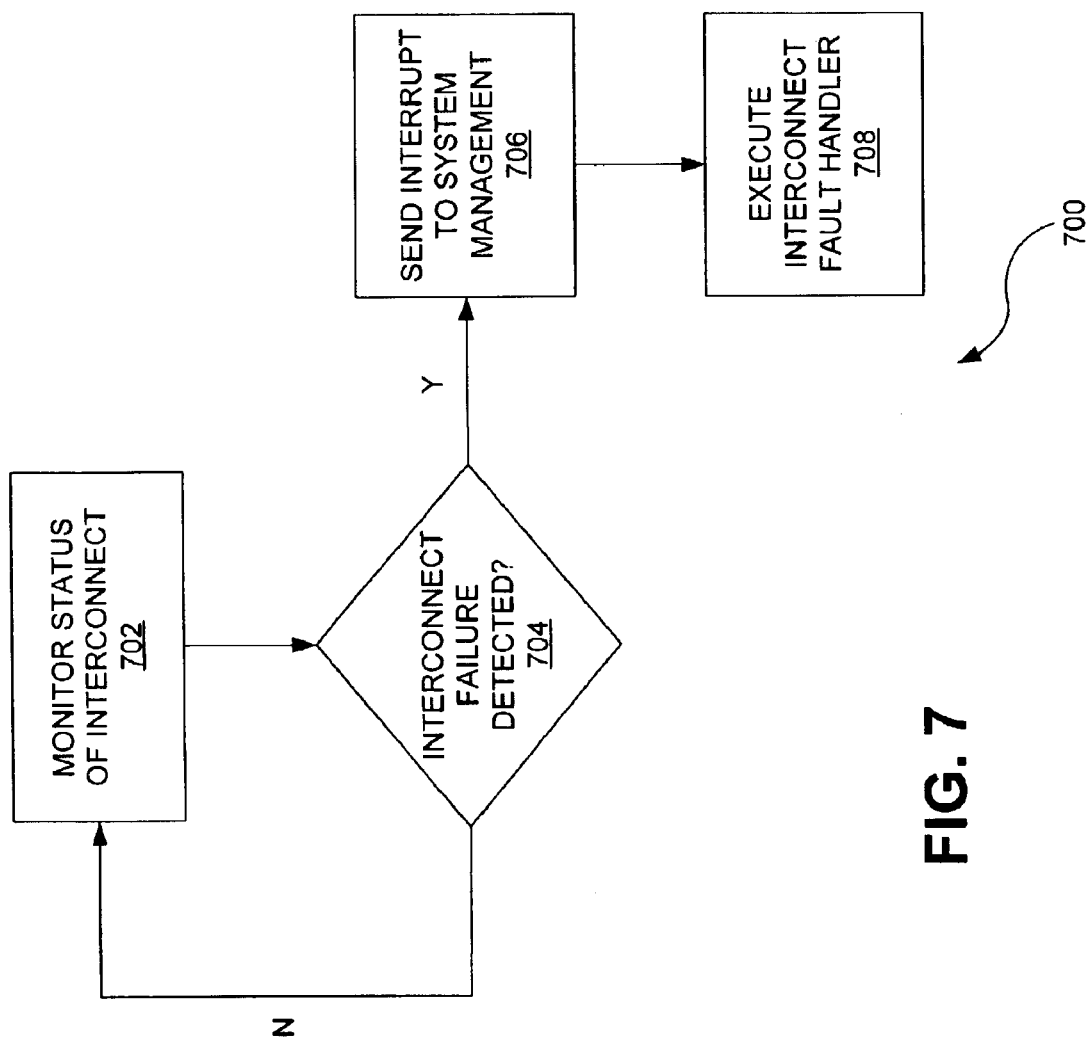
FIG. 7 is a flow chart depicting a method for detecting and communicating an interconnect failure in accordance with an embodiment of the invention.

FIG. 7 is a flow chart depicting a method 700 for detecting and communicating an interconnect failure in accordance with an embodiment of the invention. This embodiment utilizes an interrupt mechanism to report an interconnect failure.

The status of the interconnect is monitored 702. When an interconnect failure is detected 704, then an interrupt signal or message is sent 706 to the system management 302. In response, the system management 302 then proceeds to execute 708 the interconnect fault handler 304. Otherwise, if no fault is detected 704, then the monitoring 702 of the interconnect status continues.

FIG. 8A depicts a method 800 for detecting interconnect status via a periodic mechanism and storing the status data in accordance with an embodiment of the invention. After waiting 802 a period of time, the interconnect status is detected 804. The period of time may be set by the system management. The resulting status data is stored 806 in a log of such data. Subsequently, the method loops back and the next period of time begins.

Figure 8B:
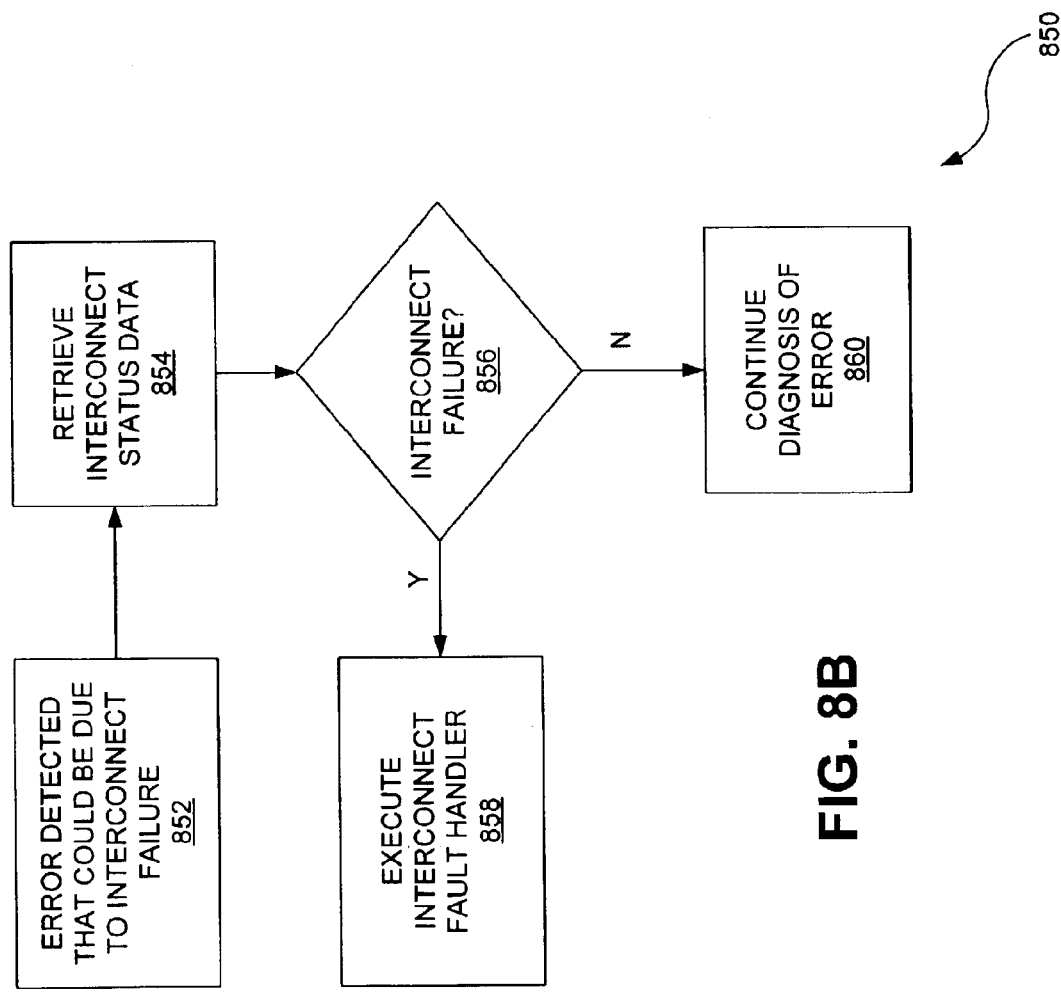

FIG. 8B depicts a method 850 for utilizing the interconnect status data in accordance with an embodiment of the invention. In this embodiment, an error is detected 852 by the system that could be due to interconnect failure, among other potential causes. For example, a clock signal may be lost, or a parity error found. Such errors may be difficult to debug in conventional systems. Here, the interconnect status data may be retrieved 854 and scanned (analyzed) to determine 856 whether or not an interconnect failure occurred that may be associated with the error. If such an interconnect failure did occur, then the interconnect fault handler routine 304 is executed 858. The interconnect fault handler routine 858 may, for example, provide an error message to the user indicating the part whose interconnection gave the failure error. If no such interconnect failure is indicated, then the system management 302 may continue in its process of diagnosing the error, if possible. If no specific cause is determined, the system management 302 may provide a more generic error message that indicates the symptom of the error (for example, lost clock signal), but not the cause.

In accordance with another embodiment, when a system error (parity, lost clock, etc.) is detected, the interconnect fault handler routine 858 may initiate one or more specific continuity tests as part of the error logging. For example, when a system error occurs, the interconnect fault handler routine 858 may include a step that tests the status of all testable connector interconnects.

In accordance with another embodiment, it may be critical to determine interconnect failures in certain applications. In such applications, a large number of pins of the connector may be used to test for interconnect continuity. For example, N pins [a first pin, an Nth pin, and (N−2) pins in between] may be dedicated for use in testing interconnectivity continuity, wherein the PCA and the electronic unit include complementary signal traces such that the first pin is electrically connected via the (N−2) pins to the Nth pin when the electronic unit is properly seated in the connector. In one specific implementation, every other pin may be utilized to test for the interconnect continuity.

In contrast to the above-described invention, conventional systems do not typically provide an explicit means to indicate a loss of continuity through an interconnect as a failure mechanism for a specific failure event. Determination of interconnect failure as a cause of a failure event is not readily accomplished in conventional systems.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A printed circuit assembly (PCA) with built-in circuitry to detect and communicate an interconnect failure, the PCA comprising:

a continuity detect circuit for detection of continuity failure in the interconnect;

a connector coupled to the continuity detect circuit and configured to interconnect to an electronic unit, the connector including a first pin which is coupled to an input of the continuity detect circuit, a second pin which is electrically grounded, a third pin, a fourth pin, and a first signal trace for electrically connecting the third and fourth pins; and an interface circuit coupled to the continuity detect circuit for communicating data pertaining to status of the interconnect to system management;

wherein the electronic unit includes a second signal trace for electrically connecting the first and third pins when the electronic unit is properly seated in the connector, and further includes a third signal trace for electrically connecting the fourth and second pins when the electronic unit is properly seated in the connector.

2. The PCA of claim 1, wherein two of said four pins are located towards opposite ends of the connector, and remaining of said four pins are towards a middle of the connector.

3. The PCA of claim 1, wherein the continuity detect circuit determines whether the first pin is held at a particular voltage level to detect proper seating of the electronic unit in the connector.

4. The PCA of claim 1, wherein the continuity detect circuit comprises a storage device for storing the data pertaining to the status of the interconnect.

5. The PCA of claim 1, wherein the interface circuit comprises a serial bus interface.

6. The PCA of claim 1, wherein the PCA comprises a motherboard of a server computer.

7. A printed circuit assembly (PCA) with built-in circuitry to detect and communicate an interconnect failure, the PCA comprising:

a connector configured to interconnect to an electronic unit, the connector including a first pin of the connector which is coupled to the continuity detect circuit, an Nth pin of the connector which is at a fixed voltage, and (N−2) pins of the connector which are dedicated for continuity testing purposes;

a continuity detect circuit coupled to the connector for detection of continuity failure in the interconnect;

an interface circuit coupled to the continuity detect circuit for communicating data pertaining to status of the interconnect to system management; and signal traces which complement signal traces on the electronic unit such that the first pin is electrically connected via the (N−2) pins to the Nth pin when the electronic unit is properly seated in the connector.

8. A method for detection and communication of an interconnect failure, the method comprising:

determining status of an interconnect between a connector on a printed circuit assembly (PCA) and an electronic unit seated in the connector, including testing a continuity of a conductive route that begins on the PCA, travels to the electronic unit, travels back to the PCA, travels to the electronic unit a second time, travels back to the PCA a second time, and ends at a fixed voltage; and communicating the status of the interconnect to system management software.

9. The method of claim 8, further comprising: storing data pertaining to the status of the interconnect in a log.

10. The method of claim 8, further comprising:

execution of a failure handling routine by the system management software in response to receiving indication of a failed interconnect status message.

11. The method of claim 8, wherein the electronic unit comprises a circuit board.

12. The method of claim 8, wherein the electronic unit comprises an integrated circuit device.

* * * * *